(12) United States Patent
Mak et al.

(10) Patent No.: US 7,220,685 B2
(45) Date of Patent: May 22, 2007

(54) METHOD FOR DEPOSITING POROUS FILMS

(76) Inventors: Cecilia Y. Mak, 5502 Sunset Hills Ct., San Jose, CA (US) 95138; Kam S. Law, 5502 Sunset Hills Ct., San Jose, CA (US) 95138

( * ) Notice: Subject to any disclaimer, the term of this patent is extended or adjusted under 35 U.S.C. 154(b) by 0 days.

(21) Appl. No.: 11/483,034

(22) Filed: Jul. 7, 2006

(65) Prior Publication Data

US 2006/0252278 A1 Nov. 9, 2006

Related U.S. Application Data

(63) Continuation-in-part of application No. 10/920,602, filed on Aug. 17, 2004, now Pat. No. 7,132,374.

(51) Int. Cl.
*H01L 21/31* (2006.01)
*H01L 21/469* (2006.01)

(52) U.S. Cl. ............................ 438/784; 257/E21.576; 438/788

(58) Field of Classification Search ................ 438/784, 438/788; 427/97.6; 257/E21.576
See application file for complete search history.

(56) References Cited

U.S. PATENT DOCUMENTS

2004/0102006 A1* 5/2004 Xu et al. .................... 438/259
2004/0102032 A1* 5/2004 Kloster et al. .............. 438/623

* cited by examiner

*Primary Examiner*—Caridad Everhart

(57) ABSTRACT

A processing method for depositing porous silica and doped silica films is provided. The method uses a cyclic scheme wherein each cycle comprises first codepositing silica with silicon, then selectively removing the silicon from the codeposit to form a porous structure. In a preferred embodiment, the codeposition is carried out by plasma enhanced chemical vapor deposition. After codeposition, the codeposit is exposed to a selective silicon removal reagent that can preferentially remove the silicon in the codeposit, leaving behind a porous structure. Repeated execution of the codeposition and the selective silicon removal steps build up thickness of the porous film. A porous film with highly uniform small pores and a desired porosity profile can be obtained with this method. This method is advantageous for forming a broad range of low-k dielectrics for semiconductor integrated circuit fabrication. The general method is also advantageous for forming other porous films for other applications.

64 Claims, 10 Drawing Sheets

METHOD FOR DEPOSITING POROUS FILMS

CROSS-REFERENCES TO RELATED APPLICATIONS

This application is a continuation-in-part of U.S. patent application Ser. No. 10/920,602, filed Aug. 17, 2004, now U.S. Pat. No. 7,132,374 the entire disclosure of which is incorporated by reference herein.

BACKGROUND OF THE INVENTION

1. Field of Invention

The present invention relates generally to a processing method for depositing porous films on a substrate. More specifically, the present invention relates to a processing method for depositing porous silica or doped silica films for fabricating semiconductor integrated circuits. The method is also advantageous for use in other applications where porous structures are required.

2. Description of Related Art

Traditionally, silicon dioxide, having a dielectric constant (k) about 4, is used as the insulator material for fabricating semiconductor integrated circuits. As device dimensions shrink, interconnect RC (resistance-capacitance) delay issues require the insulator to have a lower dielectric constant in order to deliver superior circuit performance. The semiconductor industry has identified these targets at various technology nodes and published them on the International Technology Roadmap for Semiconductors. Dielectric constant less than 4 is commonly referred to as low-k and that less than 2.2 is commonly referred to as ultralow-k. It is projected that beyond the 90 nm device generation, low-k dielectrics having a k-value below 2.6 is desirable for device fabrication.

The dielectric constant is a measure of the tendency of a material to allow an externally applied electric field to induce electric dipoles in the material. This so-called called electric polarizability is governed by the electronic, ionic and distortion polarization in the material. A good review of the polarization phenomena and a more detailed description of the various classifications of low dielectric constant materials can be found in the article by K. Maex et al. [K. Maex, M. R. Baklanov, D.

Shamiryan, F. Iacopi, S. H. Brongersma, and Z. S. Yanovitskaya, J. App. Phys., Vol. 93, No. 11, p. 8793–8841] or the chapter by S. Wolf ["Silicon Processing for The VLSI Era, Volume 4: Deep-Submicron Process Technology" by S. Wolf, Lattice Press, Sunset Beach, Calif., 2002, p. 639–670].

Fundamentally, to weaken the polarization in silicon dioxide, one can alter the structural lattice of silicon and oxygen, replace some or all of the silicon-oxygen bonds with less polarized bonds, and/or introduce free space to decrease material density in the film. Explored efforts include developing 1) silica-based doped oxides, 2) silsesquioxane-based inorganic-organic hybrid polymers, 3) organic polymers, and 4) amorphous carbon films.

Silica-based doped oxides are usually deposited by chemical vapor deposition (CVD) methods with or without plasma enhancement. Fluorine doping provides fluorosilicate glass (FSG) with a k-value about 3.6. Carbon or other alkyl substitution can reduce the dielectric constant further; some reaching k-values as low as 2.6 to 2.8. An altogether amorphous carbon film or a fluorocarbon film has been reported to yield even lower k-values. However, amorphous carbon technology is still very immature and for now is not ready for manufacturing considerations.

CVD silica-based doped oxides are appealing for use as semiconductor dielectrics due to their silicon-oxide like structure. The films require almost no modification in circuit designs. Semiconductor manufacturers can also leverage existing toolsets and infrastructures to continue their device fabrication. Some of these films have been adopted at the 180 nm, 150 nm, 130 nm, and even 90 nm nodes. However, the oxycarbide films are prone to carbon depletion in subsequent processing, resulting in a less than desired final dielectric constant. Furthermore, the incorporation of carbon in silica introduces many process complications, particularly in etching, chemical mechanical polishing, and cleaning. Consequently, implementation has been formidable and costly.

In contrast, silsesquioxane-based inorganic-organic hybrid polymers and organic polymers are inherently low-k dielectrics due to their more opened molecular lattice than silicon dioxide and less polarized bonds in the molecular components. These materials can provide a broad range of low k values. These films are usually applied by spin coating, although some can also be deposited by CVD methods. The spun film must go through curing to drive off excess solvent, complete the chemical reactions, and undergo densification. Compared to silicon dioxide, these films are generally mechanically softer and less thermally stable. They also tend to take up moisture so additional cap layers are often required to protect them. Because of the different properties, there are many restrictions in conventional processing and modifications are frequently needed to accommodate these films in process integration. Therefore, widespread adoption has not been noted.

Recently, the industry has come to conclude that there is no fully dense spin-on or CVD material that has a low enough dielectric constant and at the same time satisfy all the diverse requirements for robust integration for the 90 nm generation and beyond. Since the dielectric constant scales proportionally with the host matrix density, attention has been turned to exploring the viability of reducing the dielectric constant further by introducing porosity in the insulator.

Sol-gel techniques are known to provide a flexible means for incorporating dopants and forming a porous template in silica networks. Sol-gel techniques, however, require meticulous gellation and drying. Their different modes of processing, process control, and integration schedules are incompatible with semiconductor device manufacturing. Many of these films also exhibit deterioration of mechanical properties with decreasing k-values.

A more adaptable approach to introduce void volume in the dielectrics has been the use of sacrificial porogens [see for example, U.S. Pat. No. 6,271,273 and U.S. Pat. No. 6,451,712]. A thermally unstable material, referred to as the porogen, is blended with an organosilicate polymer and applied to form a film as in conventional spin-on dielectrics. The film is cured, then subject to an annealing step to volatize the porogen while forming a skeletal porous framework of the cured film. Critical to this thermolytic technique are: First, the porogen must separate from the thermosetting matrix and must decompose as well as removed entirely during the annealing step without leaving behind any residue. Second, the porogen decomposition must take place below the host's glass transition temperature without bringing about any collapse of the porous structure. Third, change in film stress must be carefully managed during phase separation and thermal expulsion of porogens without causing any film cracking or delamination. Porous films formed with this method usually have a broad pore size distribution with the smallest pores in the 20 nm range.

The porogen concept has also been explored with CVD techniques [see for example, U.S. Pat. No. 6,054,206 and U.S. Pat. No. 6,171,945]. Thermally unstable labile organic groups are deposited in organosilicate glass. The film is then annealed to volatize the labile organic components, resulting in a porous structure. An alternative e-beam treatment [see for example, U.S. Pat. No. 6,737,365] or ultraviolet exposure [see for example, U.S. Pat. App. 20040096672] has also been reported to be effective in removing these species and additionally enhance cross-linking of the host material. In general, nanoporous films with pores commensurate in size of the departing organic groups are obtained with this approach. The nanoporous matrix is said to provide adequate mechanical and thermal stability in subsequent processing. However, like other porogen techniques, these films are formed by volatilizing organic species. There are the same concerns for residual outgassing if the organic species that are supposed to be removed are not removed entirely. Moreover, process integration complications associated with processing carbon-containing oxide films still remain, as discussed earlier.

To date, development of low-k films continues. The object of this invention is to create a CVD process method for generating a porous low-k dielectric film that is extendable to the ultralow-k range. It is desirable that the film is chemically, mechanically, and thermally stable, similar to that of silicon dioxide. It is further desirable that process integration requirements are not excessive and costly when compared to established techniques.

BRIEF SUMMARY OF THE INVENTION

The present invention is generally directed to forming porous films. More specifically, the present invention is directed to forming porous silica or doped silica films on a substrate for fabricating semiconductor integrated circuit. The disclosed method uses a cyclic process scheme to deposit the film. In each cycle, a thin layer of silica and silicon or doped silica and silicon is first codeposited. (The codeposited film may commonly be viewed as a silicon-rich oxide or silicon-rich doped oxide). Then, the film is exposed to a chemical reagent that can preferentially remove silicon over silica in the codeposit, leaving behind a porous structure. The processing steps are repeated alternately to build up thickness of the porous film.

The pore size and pore distribution in each layer are determined by the amount of sacrificial silicon incorporated and how the silicon is dispersed in that layer. Each subsequent deposition step puts down a layer of codeposit on the previously created porous layer and the following selective silicon removal step develops the porous structure in-situ. Hence, by means of the cyclic method disclosed in this invention and by tailoring the processing conditions in each cycle, a porous film with a desired porosity profile can advantageously be obtained.

As a broader scope, this invention is generally applicable for forming other porous films using silicon as the sacrificial porogen. The method is also generally applicable for forming porous films using another suitable material as the sacrificial material for codeposition and a correspondingly suitable selective removal reagent to remove the sacrificial porogen to form a porous structure. There are three salient features in this invention: 1) the codeposition of the silica (or the host matrix material in general) with silicon (or the sacrificial material in general), 2) after the codeposition step, chemical exposure of the codeposit to a selective silicon removal reagent (or the selective removal reagent in general) to develop the porous structure, and 3) a methodology to facilitate and optimally control the repeated execution of the codeposition and the selective silicon removal (or the selective sacrificial material removal in general) steps to build up thickness of the porous film.

As an embodiment of this invention, the selective silicon removal reagent is selected from a group of molecular halides or halogenated species comprising fluorine, chlorine, bromine and their derivatives thereof. The selective silicon removal reagent can also be a vapor derived from a solution containing potassium hydroxide, or tetramethylammonium hydroxide (TMAH), or ethylene diamine pyrocatecol (EDP), or their like or derivatives thereof, optionally mixed with a high vapor pressure carrier gas such as an alcohol that do not react with the selective silicon removal reagent.

As a further embodiment, the preferred reagent to facilitate the selective silicon removal reaction is selected from the group consisting of molecular fluorine, xenon difluoride, and their combinations thereof.

In a preferred implementation of this invention, the codeposition step is carried out by plasma enhanced chemical vapor deposition (PECVD) techniques. The cyclic processing is conducted on a conventional PECVD system. A series of process recipe steps or process programs are used to automate the repeated alternate execution of codeposition and selective silicon removal in the same chamber.

In another implementation method, the cyclic processes are conducted in separate chambers in a cluster tool. The substrates are processed in dedicated chambers for codeposition and selective silicon removal. The substrates are transferred between these chambers alternately and repeatedly to receive codeposition and selective silicon removal processing.

In still another implementation method, RF power modulation is used to facilitate the cyclic execution of codeposition and selective silicon removal. When the RF power is at an optimal level for the codeposition of silica and silicon, deposition of the materials proceed. When the RF power is turned off or reduced to a low value, no dissociation occurs. At that time, the chemical actions of the selective silicon removal reagent predominate and silicon is preferentially removed from the codeposit, leaving behind a porous structure. For this implementation, RF power is used for enhancing deposition as well as for regulating timing of the cyclic execution of the codeposition and the selective silicon removal steps.

In yet another implementation method, a PECVD chamber that is equipped with multiple stages is used. Multiple substrates are processed at the same time. RF power is applied only to the stages that are undergoing codeposition. Substrates are transferred between RF and non-RF stages according to the duty cycle of the cyclic process.

The porous silica film obtained from the methods of this invention has uniformly distributed small size pores, commensurate in size and uniformity with the silicon dispersed in the codeposit. The pore size and porosity profile in the film is determined by the reactor chamber design, flow rates of the components in the reagent mixture, deposition conditions such as temperature, pressure, RF power, electrode spacing, and parameters relating to how the cyclic process is conducted such as the process cycle frequency and the duty cycle.

Other embodiments of the invention are disclosed in the claims. The process method described herein provides a means to obtain a porous low-k dielectric film for fabricating semiconductor integrated circuits. The method is also advantageous for fabricating other porous structures for other applications in fields including, but not limiting to, semiconductor, flat panel display, advanced packaging, energy storage, and advanced microsystems.

BRIEF DESCRIPTION OF THE DRAWINGS

The teachings of the present invention can be readily understood by considering the detailed description in conjunction with the accompanying drawings, in which.

DETAILED DESCRIPTION OF THE INVENTION

The present invention discloses a process method for forming porous silica or doped silica films on a substrate for semiconductor integrated circuits fabrication.

The method is also generally applicable for forming porous films of other host matrix materials using the features described in this disclosure. For simplicity in discussion, we shall focus the description primarily on porous silica films.

According to the invention, the method entails a cyclic process scheme to form the film. In each cycle, a thin layer of silica and silicon or doped silica and silicon are first codeposited. (The codeposited film may be commonly viewed as a silicon-rich oxide or silicon-rich doped oxide). Then, the silicon is selectively removed from the codeposit to create a porous silica structure. The processing steps are repeated alternately to build up thickness of the film.

For clarity, we shall refer herein "silicon" in the film as any loosely bonded silicon to silica, such as interstitial silicon or silicon bonded with hydrogen or hydroxyl, or any silicon covalently bonded to silicon, or elemental silicon, that is incorporated in the film during the codeposition. We shall refer "silica" in the film as any oxidized silicon that contains silicon fully or partially bonded to oxygen. In addition, the term "silica" is used interchangeably to refer to all types of oxidized silicon, undoped or doped with other constituents, unless otherwise stated. Silicon-rich oxide is regarded as a codeposit of silica and silicon. The term "host matrix" refers to the solid matter of the porous structure and "host matrix material" refers to the material that made up the porous structure.

Figure 1:
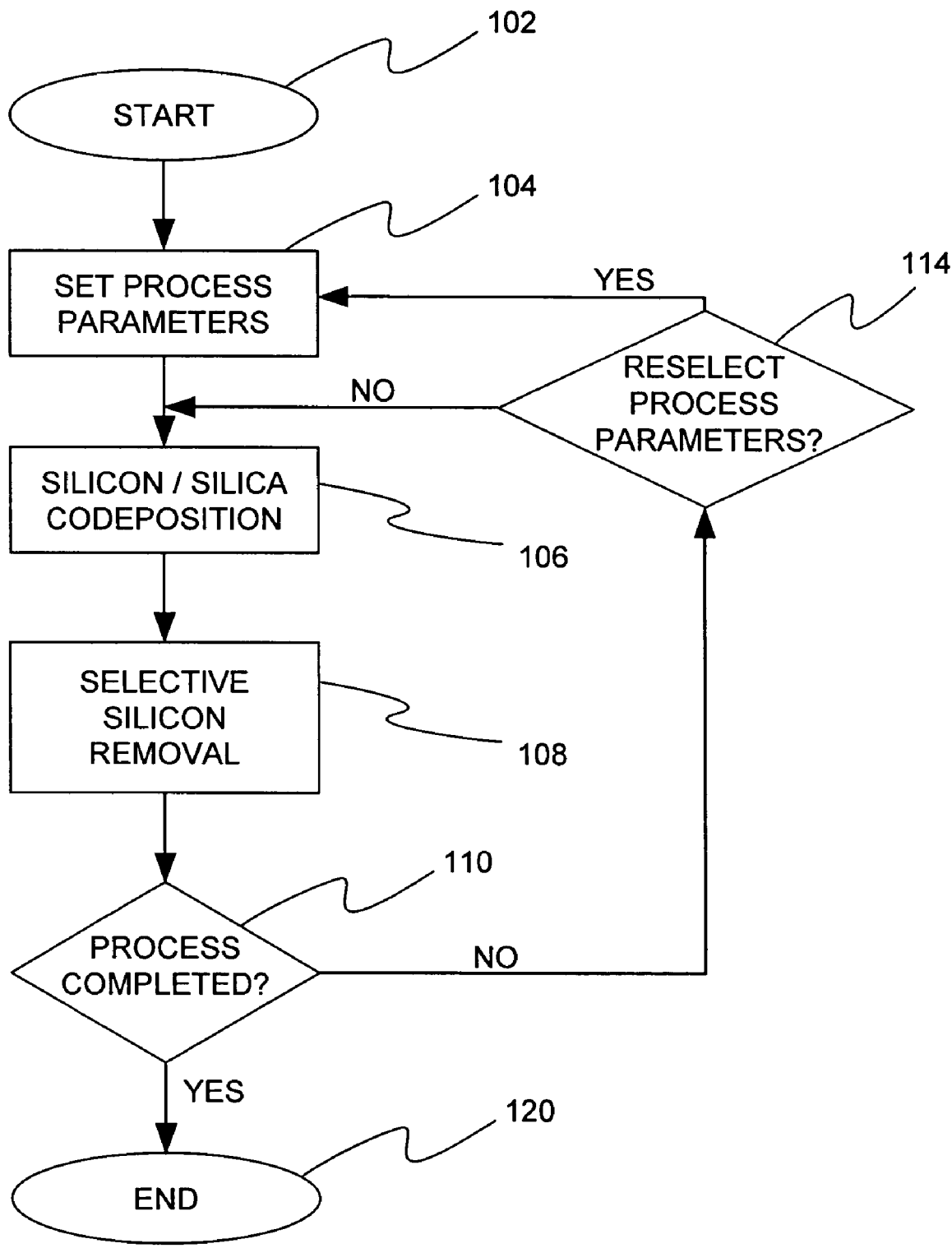
FIG. 1 is a flow diagram illustrating the sequential alternating steps of silica-silicon codeposition followed by selective removal of the silicon in the codeposit layer to form a porous silica film. After each cycle, the process conditions can be changed to tailor the porosity profile development in the film.

FIG. 1 shows a simplified flow diagram of the cyclic process and FIGS. 2A to 2I are schematic cross-sectional views of the processed film at different stages of film formation. These cross-sectional representations are simplified for illustrative purposes only and should not be taken as actual arrangement of the constituents in the codeposit film.

Figure 2A:
FIGS. 2A to 2I schematically illustrate the development of an exemplary porous film according to the cyclic codeposition and selective silicon removal process in this invention.
Figure 2B:
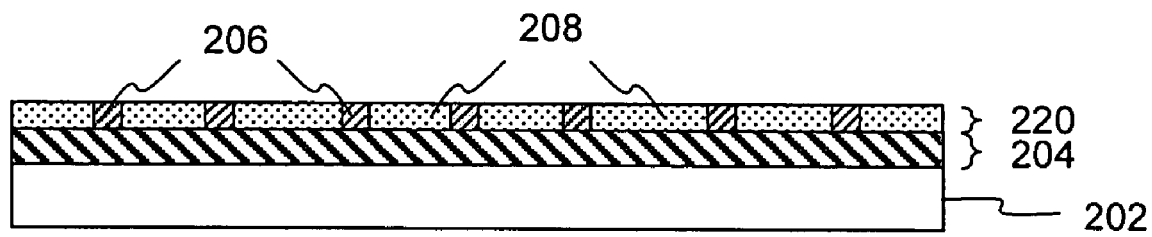

The process starts at step 102 with a substrate in the reaction chamber. In FIG. 2A, the starting substrate is illustrated as a silicon wafer 202 that have undergone some previous processing. The result from previous processing is schematically represented by a combined structure 204 on the silicon wafer. The surface of 204 is typical starting surface for processed wafers entering the stage of low-k dielectric deposition in semiconductor device fabrication. The surface 204 can alternatively be anything for other applications, including the bare surface of a silicon wafer.

At step 104, initial process parameters are set to codeposit a thin layer of silica and silicon. At step 106, deposition is conducted and produces a codeposit film 220 that comprises dispersed silicon 206 in silica 208. This is shown schematically in FIG. 2B.

Figure 2C:
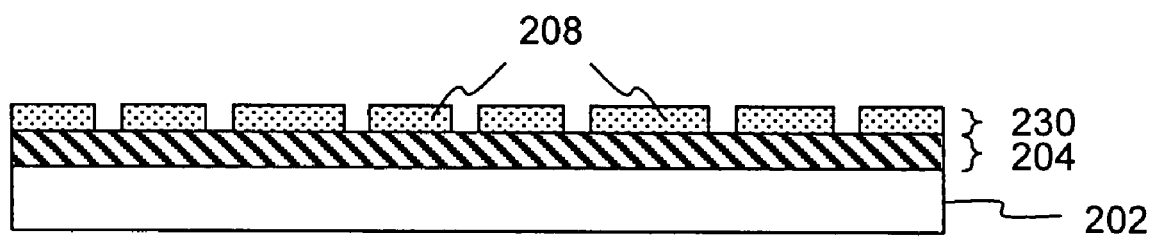

In the next step 108, silicon 206 is selectively removed from the codeposit 220. FIG. 2C shows a represented cross-section of the opened silica matrix 230 with only silica 208 remaining.

Figure 2D:
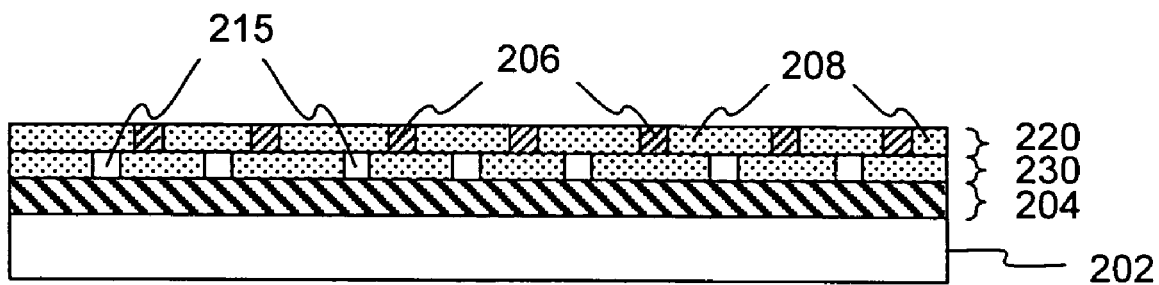
Figure 2E:
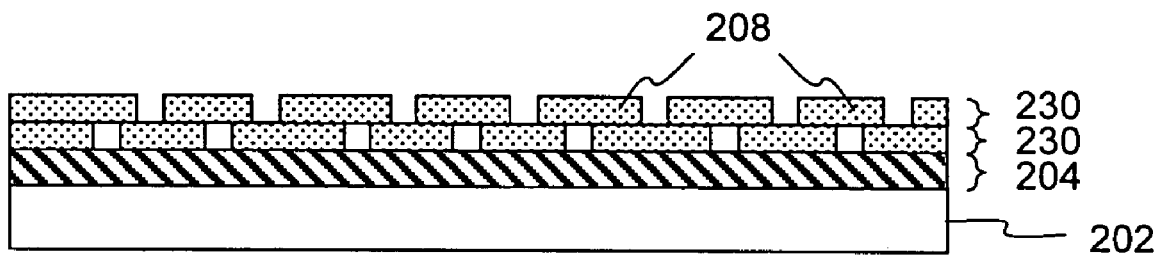
Figure 2F:
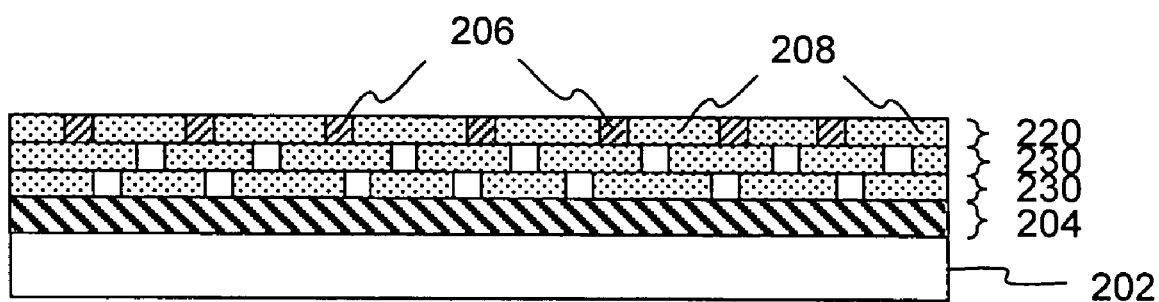
Figure 2G:
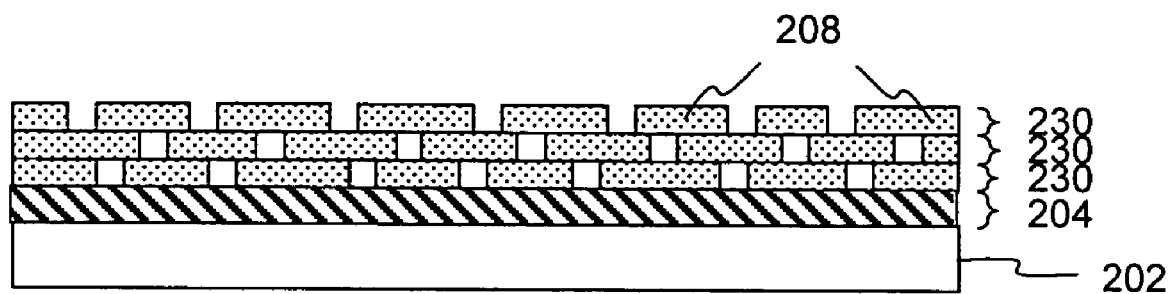
Figure 2H:
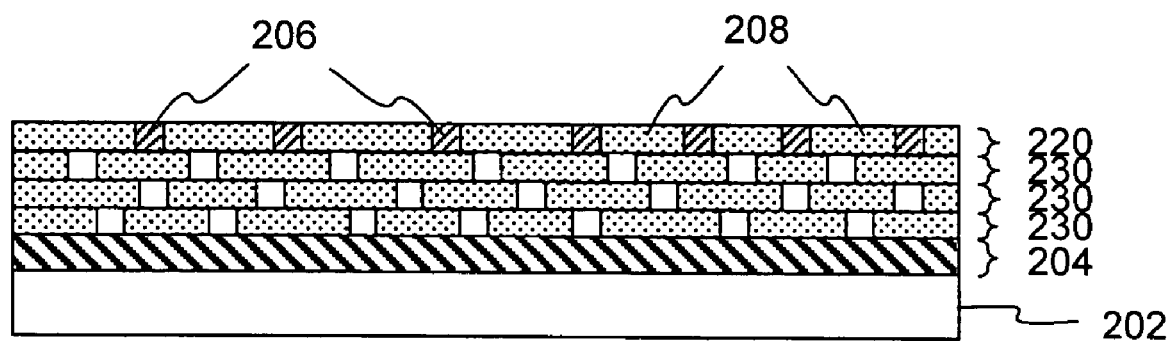
Figure 2I:
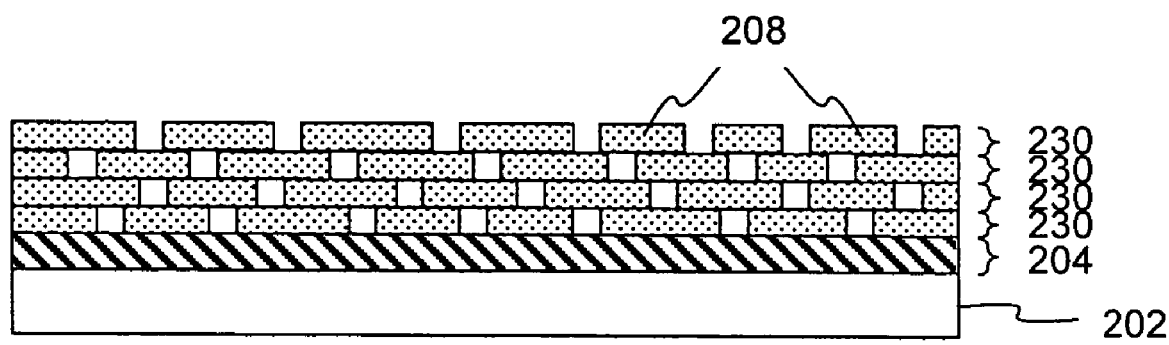

Usually more than one cycle is required to form the desired film thickness, so step 106 and 108 are repeated sequentially in the next cycle. By step 106 in the next cycle, the same codeposited layer 220 forms atop the previously created opened silica matrix layer 230, enclosing the opened spaces to form pores 215, as shown in FIG. 2D. FIG. 2E shows that after the subsequent selective removal step 108, the silicon 206 in the codeposit 220 is removed. The repeated deposition and selective removal steps now form a thicker porous silica film.

Step 110 in FIG. 1 determines if the desired film thickness has been achieved. If not, the same sequence of codeposition and selective silicon removal steps are repeated to build up thickness of the porous film. FIGS. 2A to 2I shows illustratively the result from completion of four cycles. Many more cycles can be repeated as desired. The process ends in step 120.

The pore size and pore distribution in each layer is determined by the dispersion of silicon in the codeposit and the amounts of sacrificial silicon incorporated. In light of this characteristic, the cyclic process is also flexible for obtaining a porous film with a varied porosity profile. FIGS. 3A to 3I illustrates schematically a varied porosity film that can be obtained on the same starting surface 204. Layer 238 is schematically shown to contain less silicon than Layer 220 and after the silicon removal step 108, Layer 238 will form a porous layer 240 that is less porous than Layer 230. Likewise, a more porous layer can be formed with more silicon incorporation. As a note, the porosity profile depicted in FIGS. 3A to 3I is intended for illustrative purposes only and does not limit the various profiles that can be obtained with this invention.

Figure 3A:
FIGS. 3A to 3I schematically illustrate the development of an exemplary porous film with a varied porosity profile that can be obtained with the cyclic process of this invention.
Figure 3B:
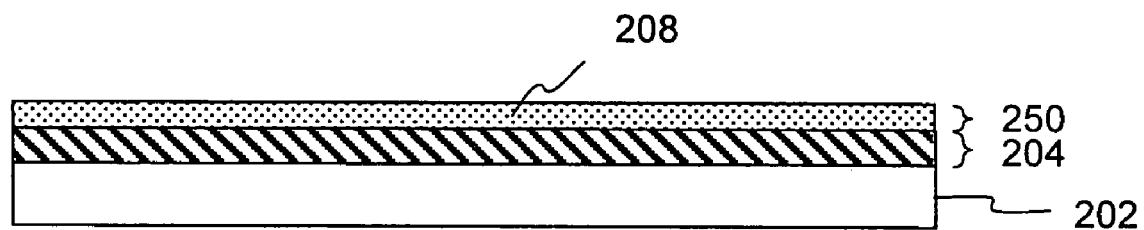
Figure 3C:
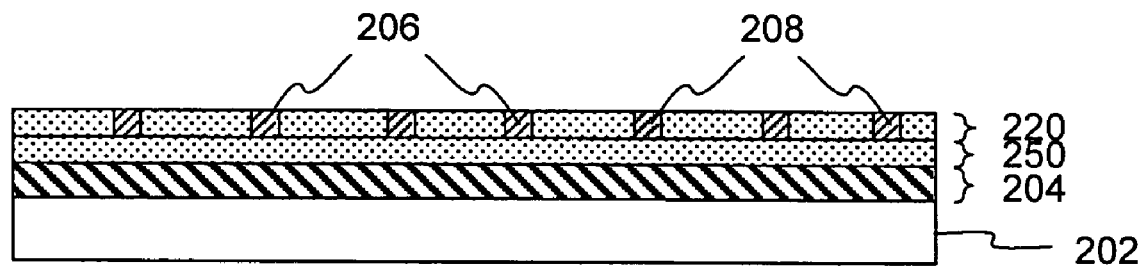
Figure 3D:
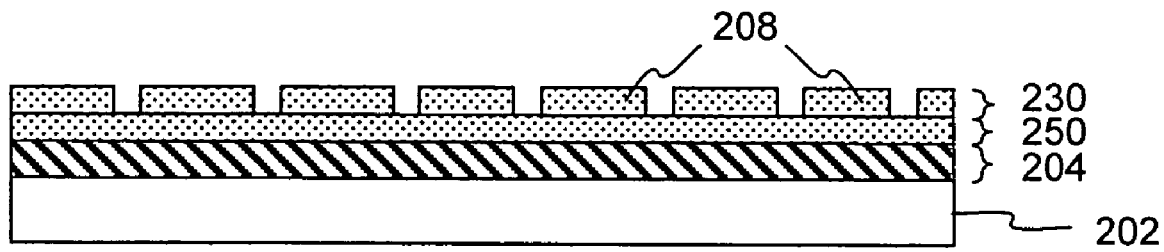
Figure 3E:
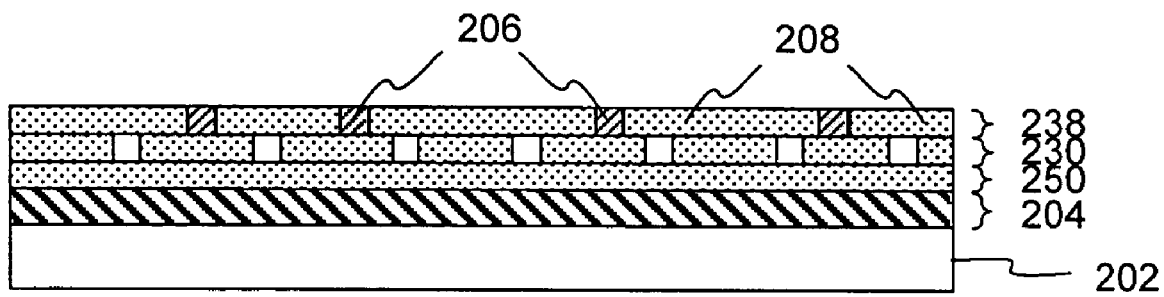
Figure 3F:
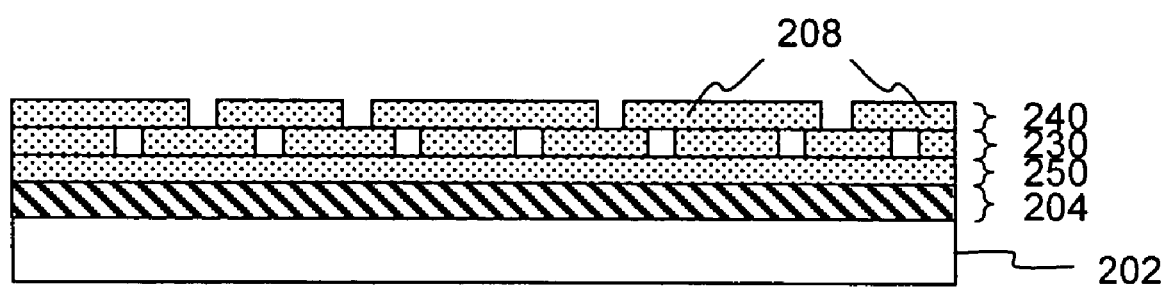
Figure 3G:
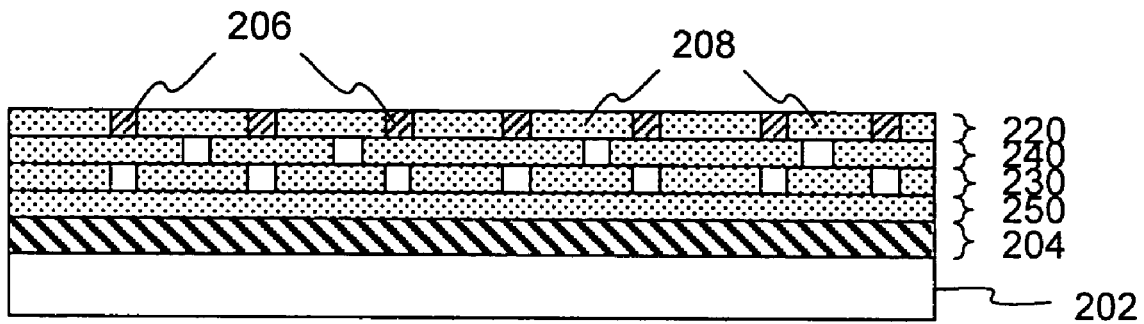
Figure 3H:
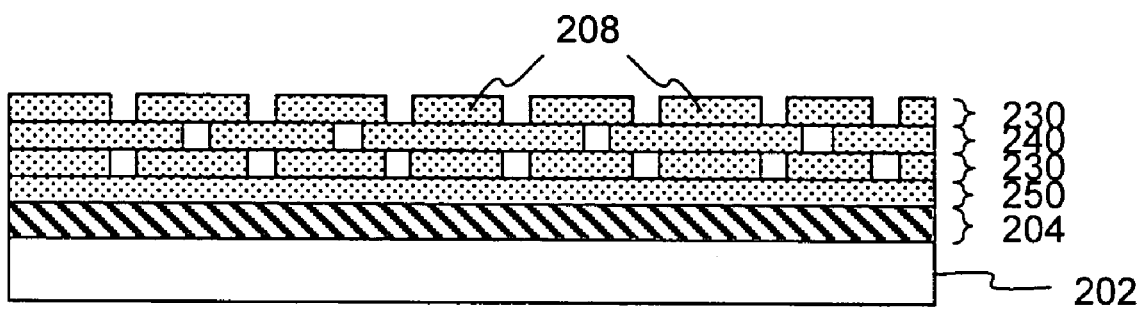
Figure 3I:
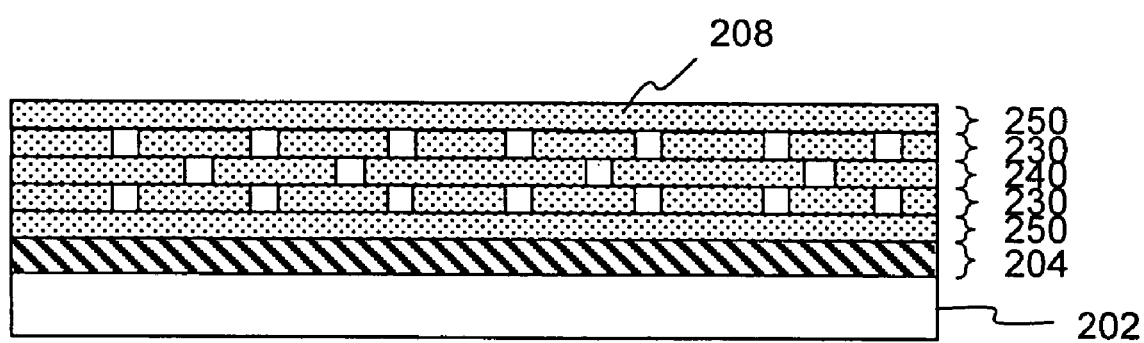

The flow diagram in FIG. 1 shows that, after each cycle, the process conditions can be reselected at step 114 to put down a different silica and silicon codeposit film. A different amount of silicon incorporated will alter the porosity of the layer. FIG. 3B and FIG. 3I show that a dense silica layer 250 can as well be formed if so desired anywhere along the thickness of the porous film. In that case, no silicon incorporation is required in the codeposition step.

As another embodiment of this invention, additional processing steps can be inserted before, within, or after the cyclic process as desired. Since the porous film is formed entirely in-situ, like layer 250 in FIG. 3I, a similarly dense liner layer, cap layer, etch stop layer, or any other process layer of a different material can be deposited together with the porous film without breaking vacuum. This is particularly advantageous in process integration, for example, in the formation of a dual damascene structure.

Unlike many other porous film formation techniques, the current method does not require any post deposition treatment to volatize the porogen. The porous silica matrix is chemically similar to dense silicon dioxide. The finely distributed pores provide good structural integrity and thermal stability. A broad range of low-k dielectrics can be obtained with this method.

Of essence in this invention are 1) the codeposition of silica (or the host matrix material in general) with silicon (or the sacrificial material in general), 2) after codeposition, a selective removal step by exposing the codeposit to a chemical reagent that can selectively remove silicon (or the sacrificial material in general) from the codeposit to create a porous structure, and 3) a methodology to facilitate repeated alternate execution of the codeposition and the selective removal steps to build up thickness of the porous film.

The use of silicon as the sacrificial material to form the porous film is an aspect in this invention. The codeposition with silicon provides a silica template from which the porous structure evolves. The selective silicon removal reagent enables the porous structure to be developed.

The selective silicon removal reagent is selected based on its differential chemical reactivity between silicon and silica (or the host matrix material in general). Pressure and temperature can further be utilized to enhance the selectivity of the reactions.

As is in the case of conventional silicon-rich PECVD silicon oxide, the silica-silicon codeposit will contain silica and some interstitial silicon atoms, silicon covalently bonded to each other, and silicon weakly bonded to hydrogen or hydroxyl groups or the like. When the codeposit is exposed to the selective silicon removal reagent, the reagent will chemically remove the silicon while the silica will remain virtually intact. The chemical reaction will proceed at a rate determined by the process temperature and the concentration of the selective silicon removal reagent in the process chamber.

The selective silicon removal reagent can be advantageously selected from a group of molecular halides or halogenated species comprising fluorine, chlorine, bromine and their derivatives thereof. The selective silicon removal reagent can also be selected from vapors derived from solutions containing potassium hydroxide, or tetramethylammonium hydroxide (TMAH), or ethylene diamine pyrocatecol (EDP), or their like or derivatives thereof, optionally mixed with a high vapor pressure carrier gas such as an alcohol that do not react with the selective silicon removal reagent.

For this invention, the preferred selective silicon removal reagent is selected from a group consisting of molecular fluorine ($F_2$), xenon difluoride ($XeF_2$), and their combinations thereof.

Any deposition methodology that can form a thin composite or codeposit film of silica (or the host matrix material in general) and silicon can be used to practice the codeposition step of the present invention. These methodologies include, but not limited to, physical vapor deposition, chemical vapor deposition, spin coating, dip immersion, spray coating, screen printing, sol-gel, electrodeposition, and many other thin film formation techniques.

Those skilled in the arts understand alternative methods of deposition and numerous forms to practice the cyclic processing without departing from the spirit of this invention. However, it is to be noted that besides the process chemistry and process conditions, the particular techniques and setup also play a role in determining the resultant porous film that can be obtained. This is due to the range of process cycle frequency and duty cycle that can be performed, which will affect not only the processing efficiency, but also the bulk and interfacial properties of the multiply-deposited layers that compose the film.

In each cycle, the process conditions and the duration of the codeposition step control the codeposit layer thickness. The duration of the selective silicon removal step is then set long enough to remove some or all of the silicon deposited in the same cycle. If too thick a layer is deposited, then the silicon removal reagent will have to work through a thick codeposit to remove the silicon. It is not time efficient, and sometimes it may not be effective even for a small reactant molecule, to diffuse far into a material to react. Conversely, depositing too thin a layer may not be desirable either, especially if the silicon incorporation is large for the construction of a high porosity film. Too thin a layer will result in a sparse silica matrix after silicon removal. The codeposit in the next cycle may fill up the gaps. Henceforth, the process cycle frequency and the duty cycle must be set in relation to the codeposition and the selective silicon removal reaction rates such that a desired pore size and porosity profile of the film can be obtained.

A preferred implementation method for this invention is to form the codeposit by plasma enhanced chemical vapor deposition techniques. The cyclic process can be conducted using a conventional PECVD system equipped with a radio frequency (RF) source at 13.56 MHz to produce plasma for deposition. While the codeposition is performed as a conventional PECVD process, no RF power is applied during the selective silicon removal step. A series of process recipe steps or process programs can be used to automate the cyclic execution of the codeposition and the selective silicon removal steps.

Another way to implement the cyclic processing is to conduct the codeposition and the selective silicon removal steps in separate reaction chambers in a cluster tool. The substrate would have to be mechanically transferred between chambers dedicated to codeposition and chambers dedicated to selective silicon removal according to the process cycle program.

The selection of the precursors for the codeposition of silica and silicon shall not be belabored here since there are numerous possibilities and those skilled in the art of PECVD understand various combinations of chemicals that can be used. Nonetheless, for the formation of a porous silica film, the codeposition reagent mixture should comprise at least one silicon-containing precursor and one oxygen-containing precursor. As an embodiment of this invention, a preferred codeposition mixture may comprise silane ($SiH_4$), nitrous oxide ($N_2O$), with or without tetraethylorthosilicate (TEOS), with or without a dilution inert gas, with or without a gas that can modify the ionic bombardment during codeposition selected from the group consisting of hydrogen ($H_2$), argon (Ar), helium, or their combination thereof.

The silane to nitrous oxide flow ratio should be between 0.005 and 100, most preferably between 0.01 and 30.

During codeposition, the PECVD chamber should be maintained at a pressure between 0.01 torr and 15 torr, most preferably between 0.1 torr and 10 torr. The electrode spacing should be set between 0.1 inch and 3 inches, most preferably between 0.3 inch and 1.5 inches. The substrate temperature should be maintained between 25° C. and 550° C., most preferably between 300° C. and 400° C. The RF power density should be between 0.01 W/cm$^2$ and 5 W/cm$^2$ most preferably between 0.2 W/cm$^2$ and 1.0 W/cm$^2$. (For clarity, here the RF power density of a symmetric parallel plate reactor is defined as the RF power divided by two times the area of the cathode or anode).

At least one selective silicon removal reagent should be used in the selective silicon removal step. The selective silicon removal reagent can be between 0.1% and 100% in the process chamber. The selective silicon removal step can conveniently be performed at the same temperature as the codeposition step if desired. This step can be performed at a temperature between 25° C. and 550° C., most preferably between 300° C. and 400° C., and a pressure between 0.01 torr and 15 torr, most preferably between 0.1 torr and 10 torr. If the codeposition step and the silicon removal step are carried out in different chambers, the pressure and the temperature of these steps can be individually optimized. The upper limit of pressure for the silicon removal step can be extended to sub-atmospheric.

Running the codeposition and the silicon removal steps as conventional PECVD and chemical processes in the same chamber nonetheless requires a significant amount of overhead between steps such as venting, purging, pump down, temperature stabilization, and pressure stabilization. If these processes are conducted on different dedicated chambers in a cluster tool, then the processing efficiency will also have to consider time taken to mechanically transport the substrate to different chambers.

As another embodiment of this invention, to reduce tact time and to increase the range of operable process cycle frequency, the cyclic process is implemented on a PECVD system with intermittent RF power modulation. The reagents for codeposition and selective silicon removal are introduced into the reactor together to form a combined mixture or separately synchronizing with the codeposition and the selective silicon removal processes. During codeposition, RF power is switched on and ionization of the codeposition mixture results in codeposition of silicon and silica. The RF power is then switched off or set at a low level such that the precursors for silica and silicon deposition cannot dissociate. The absence of RF power will discourage any plasma reactions from proceeding. During that time, the chemical actions of the selective silicon removal reagent predominate, and silicon is preferentially removed from the codeposit, leaving behind a porous structure. Resetting RF power to the codeposition level in the next modulation cycle restarts the process cycle. Thus, in this implementation, RF power is used not only for deposition, but is additionally used to regulate timing of the codeposition and the selective silicon removal steps.

Figure 4:
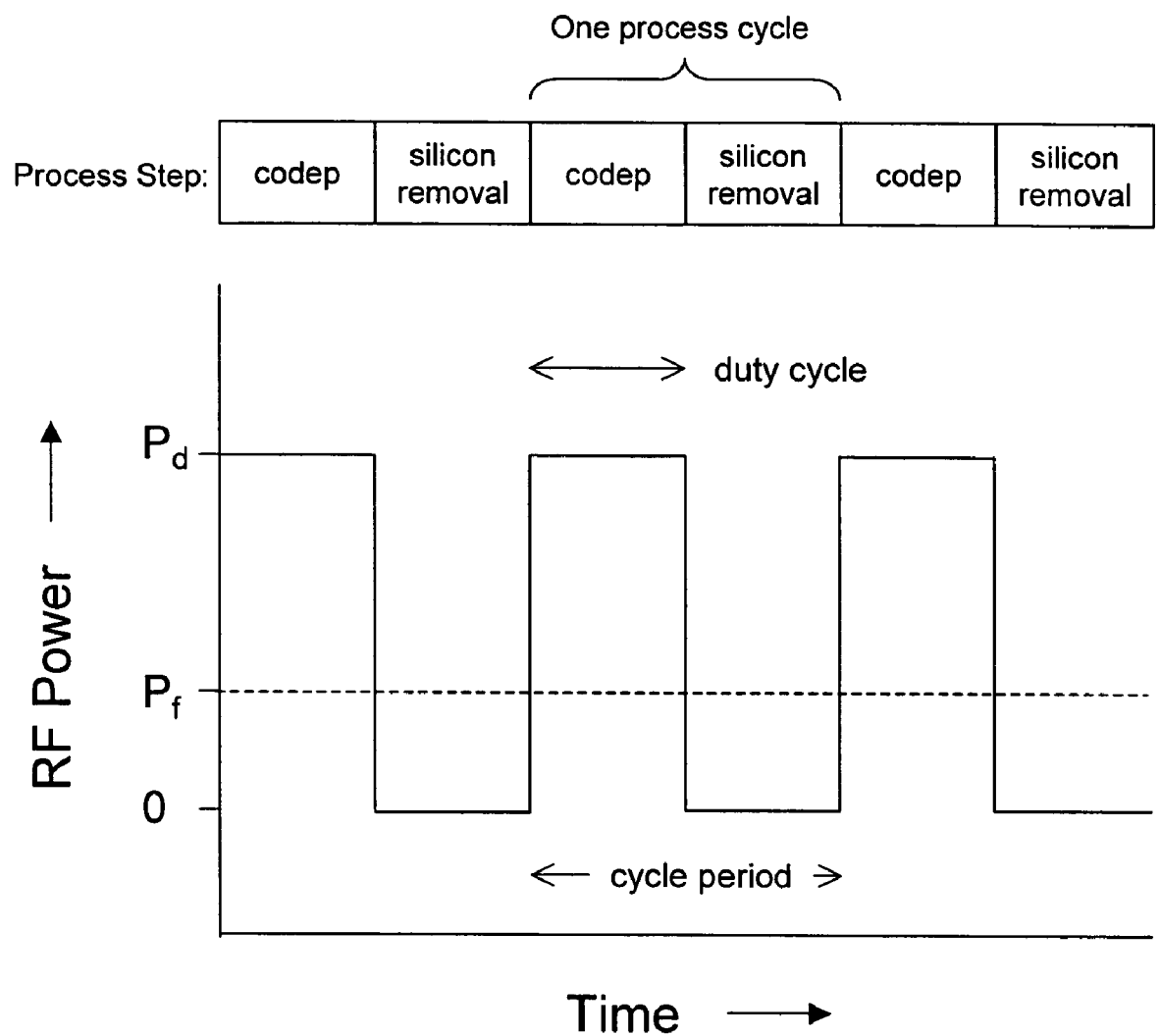
FIG. 4 is a schematic defining the process cycle frequency, cycle period, duty cycle, and illustrating the RF power level of an exemplary RF power delivery waveform.

FIG. 4 illustrates the important features in the RF power modulation control. For simplicity of illustration, the RF power waveform is represented as a rectangular pulse train in this diagram. In practice, other waveforms can also be used. The waveform is characterized by a cycle frequency, a cycle period, and a duty cycle. The cycle period is the duration of time for the completion of all the processing steps in one process cycle. The cycle frequency is the inverse of the cycle period, and the duty cycle is the proportion of time within the cycle period during which codeposition occurs.

In FIG. 4, the illustrative process cycle is shown to consist of the codeposition and the selective silicon removal steps. During codeposition, the RF power operates at $P_d$. At this power level, the RF power is high enough to dissociate the precursors for the codeposition of both silica and silicon. For the rest of the cycle, the RF power level is turned off or set to a low level. The power level must be low enough so that the precursors for silica and silicon deposition cannot dissociate. The power level must also be below $P_f$, the power level that can dissociate the selective silicon removal reagent. FIG. 4 arbitrary depicts the waveform with the power level set at zero during the selective silicon removal step.

This implementation of RF modulation allows very efficient utilization of the process chamber. The RF power can be delivered at a process cycle frequency between 0.0005 Hz and 500 Hz, more preferably between 0.1 Hz and 10 Hz. Codeposition duty cycle can be operated between 1% and 99%, more preferably between 5% and 70%.

Needless to say, this intermittent RF power modulation technique can be practiced readily on a PECVD system equipped with RF power manipulation capabilities. If RF power modulation control is not available on the PECVD system, then one can modify the RF power delivery hardware with a timing circuit or modify the system to provide a means such that the RF power delivered for deposition can intermittently be switched off or reduced to a low level as previously stated.

As yet another embodiment, the intermittent RF power modulation can be imitated by mechanically transporting the processing substrate under RF and non-RF zones. In chamber designs that have multiple stages for sequential processing [see for example, U.S. Pat No. 6,007,675], one can transfer the substrate to a separate stage in the same reactor after the codeposition step. RF power is applied only to the stage that is undergoing codeposition. In this scenario, one or more substrates can be processed at the same time in the same reactor but on different stages—some undergoing codeposition and some undergoing selective silicon removal.

The multiple-stage reactor can further be designed to accommodate any duty cycle. The chamber would be partitioned such that the substrates would spend a desired amount of time under RF power, during which time codeposition occurs, and a desired amount of time without RF power, during which time, selective silicon removal occurs. Additionally, instead of having the substrate transported at the end of each step, the substrate can be placed on a motion handler or a means that functions like a moving track. The motion handler would carry the substrate on a cyclic route to different RF and non-RF zones inside the chamber. Each zone would be configured so that the time spent under each zone corresponds to the duration of each step in the process cycle of the current invention. Japanese Patent Application JP2006-058769 describes several configurations of multi-stage chamber architecture that can be used to accomplish this implementation. Various other mechanical designs can also be used to practice the current invention without departing from the spirit of this invention.

The foregoing implementations facilitate different ranges of process cycle frequency and duty cycle to be performed. If the process chemistry, process conditions and method of implementation are selected appropriately, this invention can be used to engineer porous films with nanosize pores.

The capability is illustrated in the following example. If silicon is codeposited at an apparent[1] rate of 400 Å/min and silica is codeposited at an apparent rate of 1000 Å/min, and if the process cycle frequency is 3 Hz with 50% duty cycle (i.e., the codeposition duration is 0.167 sec), then within each cycle, only a few angstroms of the codeposit is formed. Under such condition, the size of the dispersed silicon atoms will be on the same order as the thickness of the codeposit layer. This will give rise to dispersed openings of the same size when the silicon atoms are selectively removed. The codeposit formed in the next cycle will cover these openings and enclose the space beneath. The method will produce a film with advantageous nanosize pores. Thus, porous films with pore sizes ranging from 0.3 nm to 50 nm and porosity ranging from 0.5% to 90% can be obtained with this method.

The apparent deposition rate can be calculated from the relative amount of silica ad silicon and deposited in the film within a given time interval. For exaple, the relative amout of silica and silicon in the deposit layer can be estimated from the relative amount of silicon and oxygen in the deposit determined from SIMS (secondary ion mass spectroscopy) analysis and FTIR (Fourier Trasfor Infrated) asortion spectra.

Finally, the description presented herein does not distinguish the method for formation of a porous silica film or formation of a porous doped silica films such as porous fluorine-doped silica (FSG), porous carbon-doped silica, porous phosphorous-doped silica (PSG), porous hydrogen silsesquioxane (HSQ), porous methyl silsesquioxane (MSQ), porous boron-doped silica (BSG), porous boron-phosphorus-doped silica (BPSG), or the like. In fact, it does not distinguish the method for formation of other porous films such as porous silicon nitride, porous silicon oxynitride, porous silicon carbide, porous boron nitride, porous boron oxynitride, porous aluminum oxide, porous aluminum nitride, porous aluminum oxynitride, or the like. Salient in this invention are the codeposition with silicon and the selective removal of the sacrificial silicon. Hence, the scope of this invention covers not only formation of porous silica films, but also other porous films of host matrix materials, inorganic or organic or a combination thereof.

As an example, a porous carbon-doped silica film can be formed with the present invention by codepositing carbon-containing species in the silica-silicon film. The use of selective silicon removal reagent like fluorine will attack some of the carbon in the film to form fluorocarbon species during the silicon removal step. Depending on the film constituents and the process conditions, the reaction products may be volatile and can be removed together with the silicon fluorides or they may be non-volatile and leave behind a fluorocarbon component in the film. (Note that C—F bonds are beneficial for providing hydrophobic property of the film). The desirability of the film is to be determined, but as long as the essential features of silicon codeposition and selective silicon removal is followed to form the porous film, the practice fall within the scope of this invention.

Figure 5:
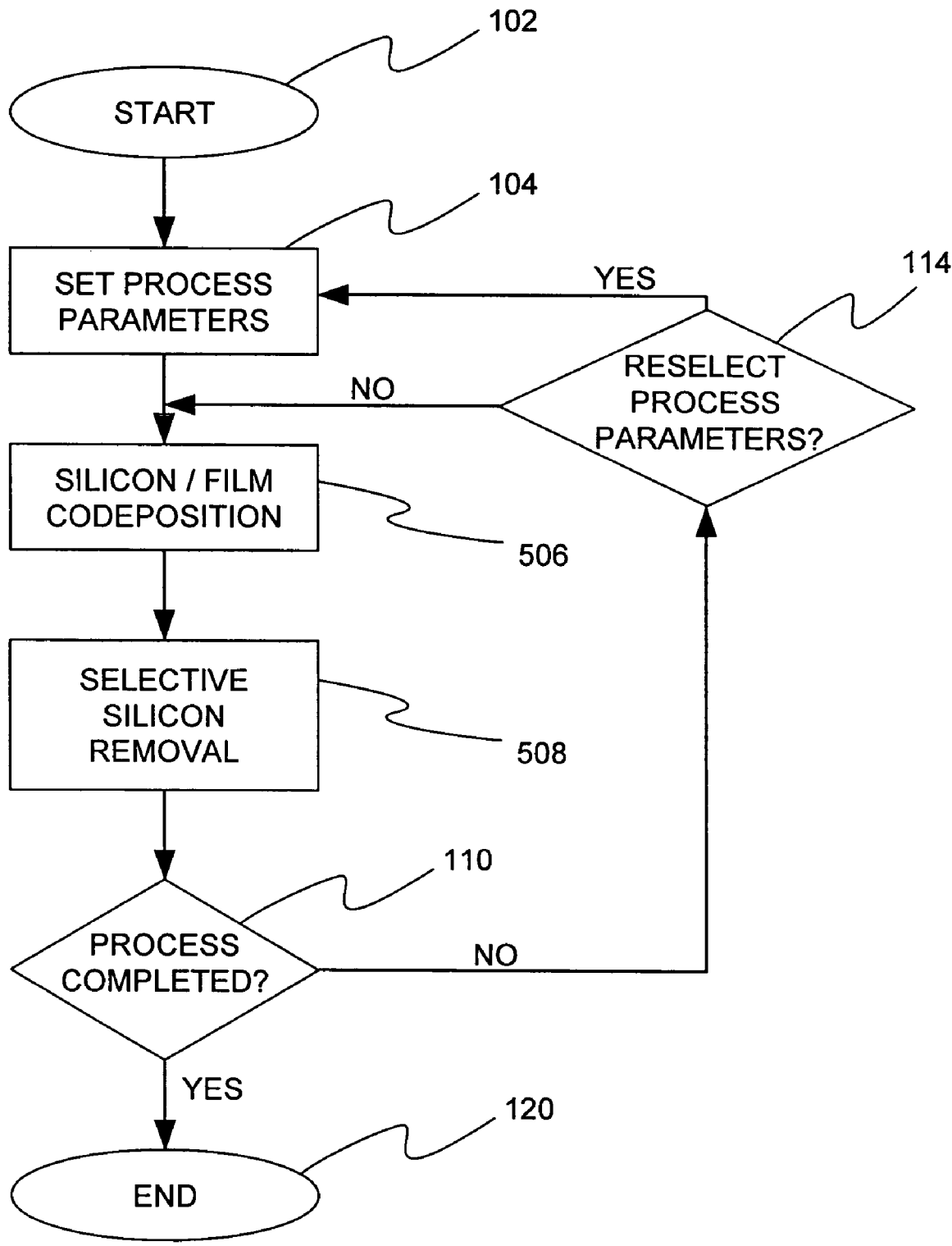
FIG. 5 is a flow diagram illustrating a generic cyclic process scheme for forming other porous films based on repeating alternating steps of silicon codeposition with the film material followed by selective silicon removal. This generic process is claimed as a broader scope of this invention.

Henceforth, in FIG. 5, we present further a generic flow diagram for the formation of porous films using the basic concept of this invention. Similar to the process flow shown in FIG. 1, but instead of step 106, the codeposition incorporates all the constituent film materials and silicon in step 506. In step 508, the selective silicon removal reagent removes silicon from the codeposit. The same embodiments that apply to the silica films apply to these cases.

In fact, the methods of this invention are also generally applicable for forming porous films using another suitable inorganic sacrificial material besides silicon. For example, the formation of a porous film using carbon or sulfur as the sacrificial material, and ozone as the selective sacrificial material removal reagent. Or another example, the use of boron or phosphorus as the sacrificial material, and xenon difluoride or a molecular halide or halogenated specie as the selective sacrificial material removal reagent. The generic concept of this invention follows: first, form a thin layer of codeposit of the host matrix material and a sacrificial material; then expose the codeposit to a selective removal reagent to remove the sacrificial material chemically, leaving behind a porous structure; then continue to repeat the steps alternately using the implementation techniques outlined in this invention to build up thickness of the porous film.

Figure 6:
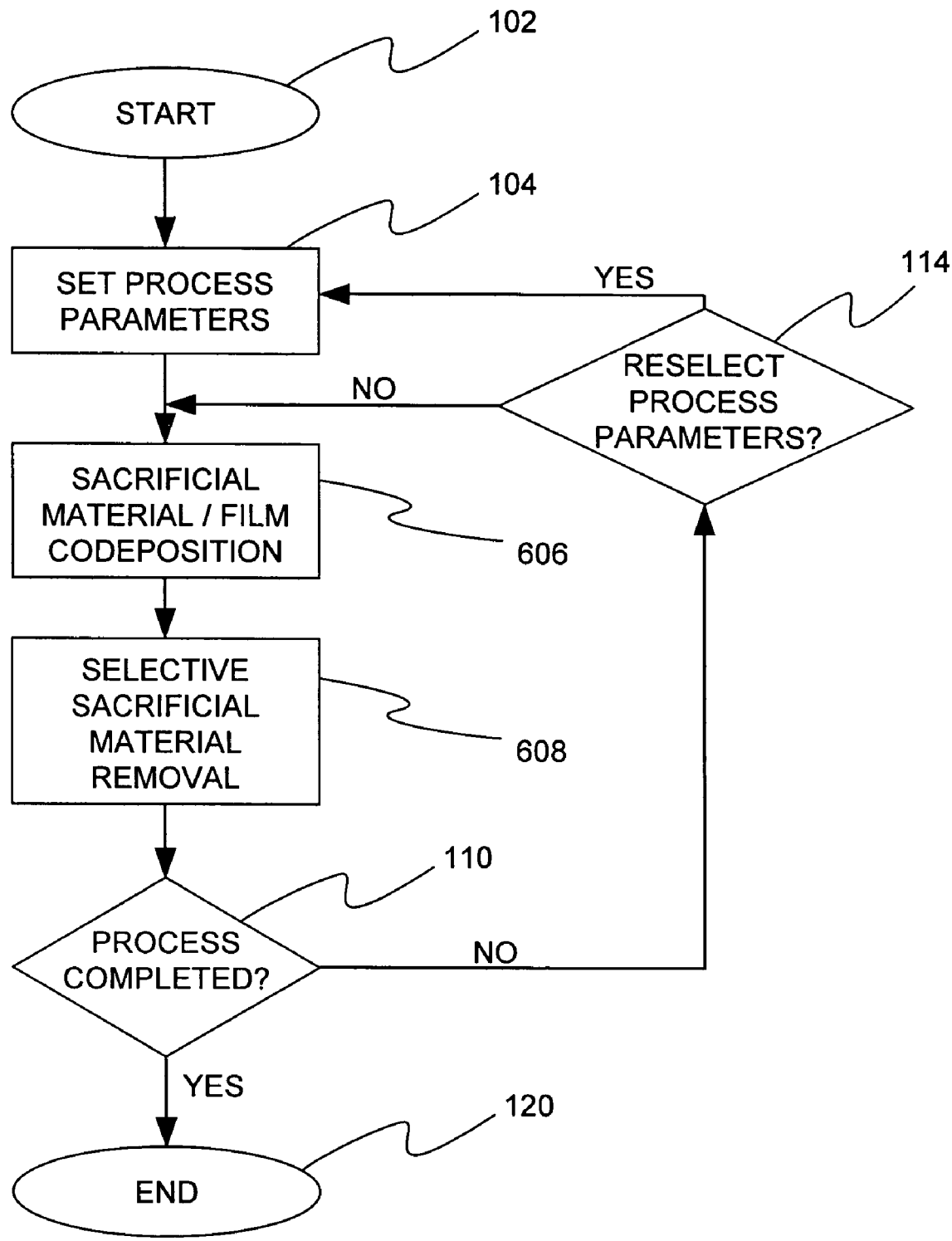
FIG. 6 is a flow diagram illustrating a generic cyclic process scheme for forming porous films based on repeating alternating steps of codeposition of the film material with a sacrificial material and a subsequent selective removal step to remove the sacrificial material in the codeposit to develop the porous structure. This generic cyclic process is claimed as a broader scope of this invention.

FIG. 6 presents a generic flow diagram for the formation of porous films using the features in this invention. Similar to the process flow shown in FIG. 5, but instead of step 506, the codeposition incorporates all the constituent film materials and the sacrificial material in step 606. In step 608, the selective removal reagent removes the sacrificial material from the codeposit. The same embodiments that apply to the silica films also apply to these cases.

In summary, the present invention can be practiced to provide porous silica and doped silica films with a broad range of low dielectric constants for semiconductor integrated circuit fabrication. The same cyclic processing method can be extended more generally to provide other porous films using silicon as the sacrificial material and using at least one of the selective silicon removal reagents to remove the silicon to form the porous film. The method can further be extended more generally to provide other porous films using another suitable sacrificial material and a correspondingly suitable removal reagent. The method is advantageous for use in many applications including and not limiting to semiconductor, flat panel display, advanced packaging, energy storage, and advanced Microsystems.

While the above description is directed to the embodiments of the present invention, other and further embodiments of the invention may be devised without departing from the basic scope thereof. For example, the use of a plasma generated from low RF frequency in the kilohertz range or from frequency range in the megahertz other than 13.56 MHz, the use of mixed frequency RF power, or different ways of generating the plasma, whether capacitively or inductively coupled, or decoupled, should all be regarded as different adaptations of the same PECVD implementation embodied in this invention. It is further to be noted that variations of the cyclic process, such as at each step, addition of any pre- and post-deposition treatment comprising plasma, electron beam, ion beam, ultraviolet, chemical, or thermal processing steps to activate the exposed film surfaces or modify the film properties do not depart from the spirit of this invention. The deposition of additional materials to enhance the film properties or assist the silicon removal reaction also does not depart from the spirit of this invention.

We claim:

1. A method for depositing a porous film of a host matrix material on a substrate, comprising a plurality of processing cycles, wherein each cycle comprises:

Codepositing the host matrix material with silicon;

After codeposition, exposing the codeposit to a reaction ambient that comprises at least a selective silicon removal reagent so that the silicon in the codeposit is preferentially removed chemically by the selective silicon removal reagent, leaving behind a porous structure;

whereby repeated execution of the codeposition and the selective silicon removal steps build up thickness of the porous film.

2. The method of claim 1 wherein the codeposition step is conducted with a deposition technique selected from the group comprising spin coating, dip immersion, spray coating, screen printing, sol-gel, electrodeposition, thermal chemical vapor deposition, physical vapor deposition, and other deposition techniques assisted by electromagnetic energy ranging from the radio frequency to the microwave spectrum.

3. The method of claim 1 wherein the film host matrix material is an inorganic or an organic material or a combination thereof.

4. The method of claim 1 wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

5. The method of claim 1 wherein the selective silicon removal reagent is selected from a group consisting of xenon difluoride, molecular halides and halogenated species comprising fluorine, chlorine, bromine, and their derivatives thereof.

6. The method of claim 1 wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof, optionally mixed with a high vapor pressure carrier gas that is chemically inert to the selective silicon removal reagent.

7. The method of claim 1 wherein the codeposition and the selective silicon removal steps are carried out in the same process chamber, or in separate process chambers in the same cluster tool.

8. The method of claim 1 wherein the concentration of the selective silicon removal reagent in the process chamber is between 0.1% and 100%.

9. The method of claim 1 for making a porous film wherein different processing conditions are used for some of the codeposition and selective silicon removal cycles to alter the porosity profile of the film.

10. The method of claim 1 for making a porous film with pore sizes ranging from 0.3 nm to 50 nm, and porosity from 0.5% to 90%.

11. The method of claim 1 further comprises at least one additional treatment step performed at selected cycle interval of the process, wherein the treatment step is selected from the group comprising plasma, electron beam, ion beam, electromagnetic radiation, chemical, thermal, or ultraviolet exposure.

12. The method of claim 1 further comprises depositing a liner layer on the substrate prior to depositing the porous film in the same deposition chamber.

13. The method of claim 1 further comprises depositing on top of the porous film a capping layer in the same deposition chamber.

14. The method of claim 1 further comprises depositing on top of the porous film a low k etch stop layer in the same deposition chamber.

15. A method for depositing a porous film of a host matrix material on a substrate in a vacuum environment, comprising a plurality of processing cycles, wherein each cycle comprises:
Codepositing the host matrix material with silicon by chemical vapor deposition techniques, with or without assistance of plasma enhancement;
After codeposition, exposing the codeposit to a reaction ambient that comprises at least a selective silicon removal reagent so that the silicon in the codeposit is preferentially removed chemically by the selective silicon removal reagent, leaving behind a porous structure;
whereby repeated execution of the codeposition and the selective silicon removal steps build up thickness of the porous film.

16. The method of claim 15 wherein the film host matrix material is an inorganic or an organic material or a combination thereof.

17. The method of claim 15 wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

18. The method of claim 15 wherein the selective silicon removal reagent is selected from a group consisting of xenon difluoride, molecular halides and halogenated species comprising fluorine, chlorine, bromine, and their derivatives thereof.

19. The method of claim 15 wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof, optionally mixed with a high vapor pressure carrier gas that is chemically inert to the selective silicon removal reagent.

20. The method of claim 15, wherein the codeposition and the selective silicon removal steps are carried out in the same process chamber, or in separate process chambers in the same cluster tool.

21. The method of claim 15 carried out in a PECVD system using recipe programs, including a series of processing steps in recipe programs, to facilitate cyclic execution of the codeposition and the selective silicon removal steps.

22. The method of claim 15 carried out on separate stages of a multistage reactor wherein the codeposition step is conducted on one stage by PECVD with RF power, and the selective silicon removal step on a different stage without RF power.

23. The method of claim 15 wherein the PECVD conditions comprise RF excitation frequency ranging from 100 kHz to 100 MHz in a single frequency mode, preferably at 13.56 MHz.

24. The method of claim 15 wherein the PECVD conditions comprise RF excitation frequency ranging from 100 kHz to 100 MHz in a mixed frequency mode.

25. The method of claim 15 wherein the codeposition is performed under conditions comprising:
Substrate temperature held between 25° C. and 550° C., preferably between 300° C. and 400° C.;
Chamber pressure maintained between 0.01 and 15 torr, preferably between 0.1 and 10 torr;

Electrode spacing held between 0.1 and 15 inches, preferably between 0.3 and 1.5 inches;

RF power density between 0.01 and 5 W/cm$^2$, preferably between 0.2 and 1.0 W/cm$^2$.

26. The method of claim 15 wherein the selective silicon removal is performed at a temperature between 25° C. and 550° C., preferably between 300° C. and 400° C.

27. The method of claim 15 wherein the selective silicon removal is performed at chamber pressure maintained between 0.01 and 700 torr, preferably between 0.1 to 10 torr.

28. The method of claim 15 wherein the codeposition reagent mixture comprises silane and nitrous oxide, in the flow ratio between 0.005 and 100, preferably between 0.01 and 30, and optionally a gas that can modify the ionic bombardment during codeposition selected from the group consisting of argon, hydrogen, helium, or their combination thereof.

29. The method of claim 15 wherein the concentration of the selective silicon removal reagent in the process chamber is between 0.1% and 100%.

30. The method of claim 15 for making a porous film wherein different processing conditions are used for some of the codeposition and selective silicon removal cycles to alter the porosity profile of the film.

31. The method of claim 15 for making a porous film with pore sizes ranging from 0.3 nm to 50 nm, and porosity from 0.5% to 90%.

32. The method of claim 15 further comprises at least one additional treatment step performed at selected cycle interval of the process, wherein the treatment step is selected from the group comprising plasma, electron beam, ion beam, electromagnetic radiation, chemical, thermal, or ultraviolet exposure.

33. The method of claim 15 further comprises depositing a liner layer on the substrate prior to depositing the porous film in the same deposition chamber without breaking vacuum.

34. The method of claim 15 further comprises depositing on top of the porous film a capping layer in the same deposition chamber without breaking vacuum.

35. The method of claim 15 further comprises depositing on top of the porous film a low k etch stop layer in the same deposition chamber without breaking vacuum.

36. A method based on plasma enhanced chemical vapor deposition techniques for depositing a porous film of a host matrix material on a substrate in a vacuum environment, comprising:

Providing a substrate to a vacuum environment;

Introducing into the vacuum environment precursors comprising chemical reagents known to those skilled in the arts for facilitating the PECVD of the film host matrix material and the PECVD of silicon;

Additionally introducing to the reaction mixture at least one selective silicon removal reagent;

Applying RF power modulation to the gaseous reactants to control a plurality of processing cycles, wherein during each modulation cycle, PECVD codeposition of the host matrix material with silicon first proceeds, followed by preferential chemical removal of the silicon in the codeposit by the chemical actions of the selective silicon removal reagent, leaving behind a porous structure.

37. The RF power modulation waveform in claim 36 wherein the RF power level for a duration within the cycle is set at a level suitable for both the deposition of the film host matrix material and the deposition of silicon, and the RF power level for a later duration within the same cycle is turned off or reduced to a level below the lower of that which is required for any deposition to occur or dissociation of the selective silicon removal reagent.

38. The method of claim 36, wherein the film host matrix material is an inorganic or an organic material or a combination thereof.

39. The method of claim 36, wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

40. The method of claim 36, wherein the selective silicon removal reagent is selected from a group consisting of xenon difluoride, molecular halides and halogenated species comprising fluorine, chlorine, bromine, and their derivatives thereof.

41. The method of claim 36 wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof, optionally mixed with a high vapor pressure carrier gas that is chemically inert to the selective silicon removal reagent.

42. The method of claim 36 carried out in a PECVD system equipped with RF power modulation capability, or in a PECVD system modified to provide a means to enable control of RF power level change to facilitate cyclic execution of the codeposition step, which requires RF power, and the selective silicon removal step, which does not require RF power but can accommodate a level of RF power below that which is required for the dissociation of the selective silicon removal reagent.

43. The method of claim 36 wherein the RF power is delivered at a process cycle frequency from 0.0005 Hz to 500 Hz with codeposition duty cycle ranging from 1% to 99%, preferably at a process cycle frequency from 0.1 Hz to 10 Hz with codeposition duty cycle ranging from 5% to 70%.

44. The method of claim 36 wherein the PECVD conditions comprise RF excitation frequency ranging from 100 kHz to 100 MHz in a single frequency mode, preferably at 13.56 MHz.

45. The method of claim 36 wherein the PECVD conditions comprise RF excitation frequency ranging from 100 kHz to 100 MHz in a mixed frequency mode.

46. The method of claim 36 wherein the codeposition is performed under conditions comprising:

Substrate temperature held between 25° C. and 550° C., preferably between 300° C. and 400° C.;

Chamber pressure maintained between 0.01 and 15 torr, preferably between 0.1 and 10 torr;

Electrode spacing held between 0.1 and 3 inches, preferably between 0.3 and 1.5 inches;

RF power density between 0.01 and 5 W/cm$^2$, preferably between 0.2 and 1.0 W/cm$^2$.

47. The method of claim 36 wherein the codeposition reagent mixture comprises silane and nitrous oxide, in the flow ratio between 0.005 and 100, preferably between 0.01 and 30, and optionally a gas that can modify the ionic bombardment during codeposition selected from the group consisting of argon, hydrogen, helium, or their combination thereof.

48. The method of claim 36 wherein the concentration of the selective silicon removal reagent in the reagent mixture is between 0.1% and 50%.

49. The method of claim 36 for making a porous film wherein different processing conditions are used for some of the codeposition and selective silicon removal cycles to alter the porosity profile of the film.

50. The method of claim 36 for making a porous film with pore sizes ranging from 0.3 nm to 50 nm, and porosity from 0.5% to 90%.

51. The method of claim 36 further comprises at least one additional treatment step performed at selected cycle interval of the process, wherein the treatment step is selected from the group comprising plasma, electron beam, ion beam, electromagnetic radiation, chemical, thermal, or ultraviolet exposure.

52. The method of claim 36 further comprises depositing a liner layer on the substrate prior to depositing the porous film in the same deposition chamber without breaking vacuum.

53. The method of claim 36 further comprises depositing on top of the porous film a capping layer in the same deposition chamber without breaking vacuum.

54. The method of claim 36 further comprises depositing on top of the porous film a low k etch stop layer in the same deposition chamber without breaking vacuum.

55. A method for depositing a porous film of a host matrix material on a substrate, comprising a plurality of processing cycles, wherein each cycle comprises:

Codepositing the host matrix material with a sacrificial material;

After codeposition, exposing the codeposit to a reaction ambient that comprises at least a chemical reagent that can preferentially remove the sacrificial material over the host matrix material in the codeposit, leaving behind a porous structure;

whereby repeated execution of the codeposition and the selective sacrificial material removal steps build up thickness of the porous film.

56. The method of claim 55 wherein the codeposition step is conducted with a deposition technique selected from the group comprising spin coating, dip immersion, spray coating, screen printing, sol-gel, electrodeposition, thermal chemical vapor deposition, chemical vapor deposition with or without plasma enhancement, physical vapor deposition, and other deposition techniques assisted by electromagnetic energy ranging from the radio frequency to the microwave spectrum.

57. The method of claim 55 wherein the film host matrix material is an inorganic or an organic material or a combination thereof.

58. The method of claim 55 wherein the sacrificial material is selected from the group comprising silicon, carbon, sulfur, boron, phosphorus, or other inorganic materials, or their derivatives or combinations thereof.

59. The method of claim 55 wherein the selective removal reagent is selected from a group consisting of oxygen, ozone, molecular fluorine, xenon difluoride, other molecular halides and halogenated species comprising fluorine, chlorine, bromine, or their derivatives or combinations thereof.

60. A method based on plasma enhanced chemical vapor deposition techniques for depositing a porous film of a host matrix material on a substrate in a vacuum environment, comprising:

Providing a substrate to a vacuum environment;

Introducing into the vacuum environment precursors comprising chemical reagents known to those skilled in the arts for facilitating the PECVD of the film host matrix material and the PECVD of a sacrificial material;

Additionally introducing to the reaction mixture at least a chemical reagent that can preferentially remove the sacrificial material over the host matrix material;

Applying RF power modulation to the gaseous reactants to control a plurality of processing cycles, wherein during each modulation cycle, PECVD codeposition of the host matrix material with the sacrificial material first proceeds, followed by preferential chemical removal of the sacrificial material in the codeposit by the chemical actions of the selective sacrificial material removal reagent, leaving behind a porous structure.

61. The RF power modulation waveform in claim 60 wherein the RF power level for a duration within the cycle is set at a level suitable for both the deposition of the film host matrix material and the deposition of the sacrificial material, and the RF power level for a later duration within the same cycle is turned off or reduced to a level below the lower of that which is required for any deposition to occur or dissociation of the selective sacrificial material removal reagent.

62. The method of claim 60 wherein the film host matrix material is an inorganic or an organic material or a combination thereof.

63. The method of claim 60 wherein the sacrificial material is selected from the group comprising silicon, carbon, sulfur, boron, phosphorus, or other inorganic materials, or their derivatives or combinations thereof.

64. The method of claim 60 wherein the selective removal reagent is selected from a group consisting of oxygen, ozone, molecular fluorine, xenon difluoride, other molecular halides and halogenated species, comprising fluorine, chlorine, bromine, or their derivatives or combinations thereof.

* * * * *